United States Patent
Liu et al.

(10) Patent No.: US 11,940,732 B2
(45) Date of Patent: Mar. 26, 2024

(54) COATING COMPOSITIONS AND METHODS OF FORMING ELECTRONIC DEVICES

(71) Applicant: Rohm and Haas Electronic Materials LLC, Marlborough, MA (US)

(72) Inventors: Sheng Liu, Bow, NH (US); James F. Cameron, Brookline, MA (US); Shintaro Yamada, Shrewsbury, MA (US); Iou-Sheng Ke, Andover, MA (US); Keren Zhang, Kirkland, WA (US); Suzanne M. Coley, Mansfield, MA (US); Li Cui, Westborough, MA (US); Paul J. LaBeaume, Auburn, MA (US); Deyan Wang, Hudson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 209 days.

(21) Appl. No.: 17/231,417

(22) Filed: Apr. 15, 2021

(65) Prior Publication Data
US 2021/0341840 A1  Nov. 4, 2021

Related U.S. Application Data

(60) Provisional application No. 63/019,326, filed on May 2, 2020.

(51) Int. Cl.
| | | |
|---|---|---|
| *G03F 7/11* | (2006.01) | |
| *C09D 4/06* | (2006.01) | |
| *C09D 7/47* | (2018.01) | |
| *C09D 7/63* | (2018.01) | |
| *G03F 7/025* | (2006.01) | |
| *G03F 7/075* | (2006.01) | |
| *G03F 7/09* | (2006.01) | |
| *G03F 7/16* | (2006.01) | |
| *G03F 7/20* | (2006.01) | |

(52) U.S. Cl.
CPC .............. *G03F 7/11* (2013.01); *C09D 4/06* (2013.01); *C09D 7/47* (2018.01); *C09D 7/63* (2018.01); *G03F 7/025* (2013.01); *G03F 7/0752* (2013.01); *G03F 7/091* (2013.01); *G03F 7/094* (2013.01); *G03F 7/16* (2013.01); *G03F 7/2016* (2013.01)

(58) Field of Classification Search
CPC ........... G03F 7/11; G03F 7/094; G03F 7/091; G03F 7/025; G03F 7/0384; C07C 15/54; C07C 33/28
See application file for complete search history.

(56) References Cited

U.S. PATENT DOCUMENTS

| | | | |
|---|---|---|---|
| 5,965,679 A | 10/1999 | Godschalx et al. | |
| 6,121,495 A | 9/2000 | Babb et al. | |
| 9,581,905 B2 * | 2/2017 | Nakafuji | G03F 7/168 |
| 2007/0195682 A1 * | 8/2007 | Duerig | G11B 9/1454 |
| | | | 369/126 |
| 2015/0166711 A1 * | 6/2015 | Cui | C08G 8/04 |
| | | | 528/137 |
| 2016/0347965 A1 | 12/2016 | Umezaki et al. | |
| 2018/0157175 A1 * | 6/2018 | Liu | G03F 7/091 |
| 2020/0142309 A1 * | 5/2020 | Liu | G03F 7/094 |

FOREIGN PATENT DOCUMENTS

| | | | | |
|---|---|---|---|---|
| KR | 2019050531 A | * | 5/2019 | ............. C08G 61/10 |
| WO | WO-2004095569 A1 | * | 11/2004 | ........... B05D 3/0254 |

OTHER PUBLICATIONS

English translation of KR2019050531. (Year: 2019).*
Kobayashi, et al, "1,3,5-Tris(functionalised-phenylethynyl)benzene-metal complexes: synthetic survey of mesoporous coordination polymers and investigation of their carbonisation", Journal of Materials Chemistry, 2008, pp. 1037-1045; vol. 18.
Smith, et al, "Polyarylene networks via Bergman cyclopolymerization of Bis-ortho-diynyl Arenes", Advanced Functional Materials, 2007, pp. 1237-1246, vol. 17.
Hergenrother, et al, "The Use, Design, Synthesis and Properties of High Performance/High Temperature Polymers: an Overview", High Performance Polymers, 2003, pp. 3-45, vol. 15.

* cited by examiner

*Primary Examiner* — Chanceity N Robinson
*Assistant Examiner* — Anna Malloy
(74) *Attorney, Agent, or Firm* — Jonathan D. Baskin

(57) ABSTRACT

Coating compositions comprise: a curable compound comprising: a core chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and three or more substituents of formula (1)

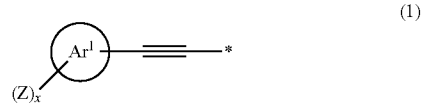

wherein at least two substituents of formula (1) are attached to the aromatic core; provided that no substituents of formula (1) are in an ortho position to each other on the same aromatic ring of the core; a polymer; and one or more solvents, wherein the total solvent content is from 50 to 99 wt % based on the coating composition.

18 Claims, No Drawings

COATING COMPOSITIONS AND METHODS OF FORMING ELECTRONIC DEVICES

BACKGROUND OF THE INVENTION

The present invention relates generally to the field of electronic device manufacture, and more specifically to the field of coating compositions for use in the manufacture of electronic devices such as semiconductor devices.

It is well-known in lithographic processes that a resist pattern can collapse due to surface tension from the developer used if the resist pattern is relatively tall versus its width (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, for example, different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer formation include chemical vapor deposited (CVD) carbon and solution-processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution-processed high-carbon content materials for underlayers. The underlayer materials should ideally meet the following properties: capable of being cast onto a substrate by spin-coating; thermal-set upon heating with low out-gassing and sublimation; soluble in common processing solvents for good equipment compatibility; have appropriate n and k values to work in conjunction with currently used silicon hardmask and bottom anti-reflectant (BARC) layers to impart low reflectivity necessary for photoresist imaging; thermally stable up to >400° C. so as to not be damaged during subsequent processes, for example, CVD such as silicon-oxy-nitride (SiON) CVD processes; and resistant to stripping by common solvents used in overcoated photoresist or other layers.

It is well-known that materials of relatively low molecular weight have relatively low viscosity, and can flow into features in a substrate, such as vias and trenches, to afford planarizing layers. Underlayer materials must be able to planarize with relatively low out-gassing up to 400° C. For use as a high-carbon content underlayer, it is desired for any composition to be thermally set upon heating. U.S. Pat. No. 9,581,905 B2 discloses compounds of the formula

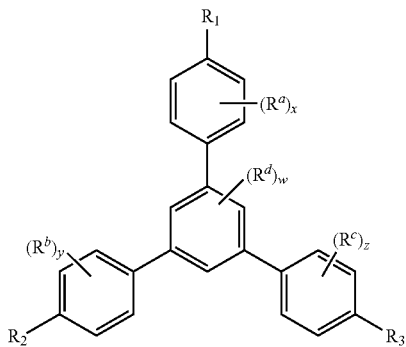

where $R_1$, $R_2$ and $R_3$ each independently represent the formula $R^A$—C≡C—$R^B$—, where $R^A$ can be, inter alia, an aryl group substituted with at least one of a hydroxyl group and an aryl group, and $R^B$ is a single bond or an aryl group, where such compounds are useful in forming underlayers in the manufacture of semiconductor devices. Such compounds, however, cure at relatively high temperatures.

There is a need in the art for coating compositions useful in forming electronic devices, and for methods of using such compositions, that address one or more problems associated with the state of the art.

SUMMARY OF THE INVENTION

In accordance with a first aspect of the invention, coating compositions are provided. The coating compositions comprise: a first curable compound comprising: an aromatic core chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heterocyclic aromatic ring system, and three or more substituents of formula (1)

wherein at least two substituents of formula (1) are attached to the aromatic core; and wherein: $Ar^1$ is chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Z is a substituent independently chosen from $OR^1$, protected hydroxyl, carboxyl, protected carboxyl, $SR^1$, protected thiol, —O—C(=O)—$C_{1-6}$ alkyl, halogen, and $NHR^2$; wherein each $R^1$ is independently chosen from H, $C_{1-10}$ alkyl, $C_{2-10}$ unsaturated hydrocarbyl, and $C_{5-30}$ aryl; each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to the total number of available aromatic ring atoms in $Ar^1$; and * denotes the point of attachment to the core; provided that no substituents of formula (1) are in an ortho position to each other on the same aromatic ring of the core; a polymer; and one or more solvents, wherein the total solvent content is from 50 to 99 wt % based on the coating composition.

In accordance with a further aspect of the invention, coated substrates are provided. The coated substrates comprise: an electronic device substrate; and a layer formed from a coating composition as described herein on a surface of the electronic device substrate. The layer may function in one or more capacities, for example, as a photoresist underlayer, a planarizing layer, a gap-filling layer, a protective layer, or a combination thereof.

In accordance with a further aspect of the invention, methods of forming electronic devices are provided. The methods comprising: (a) providing an electronic device substrate; (b) coating a layer of a coating composition as described herein on a surface of the electronic device substrate; and (c) curing the layer of the curable compound to form a cured layer. In a further aspect of the method, the cured layer is a photoresist underlayer useful in a patterning process. The method further comprises: (d) forming a photoresist layer over the underlayer; (e) patternwise exposing the photoresist layer to activating radiation; (f) developing the exposed photoresist layer to form a pattern in the photoresist layer; and (g) transferring the pattern to the underlayer. In a further aspect of the method, one or more of a silicon-containing layer, an organic antireflective coating layer, or a combination thereof can be coated over the underlayer before step (d). In a further aspect, the pattern can be transferred to the one or more of the silicon-containing layer, the organic antireflective coating layer, or the combination thereof after step (f) and before step (g). In yet a further aspect, the method can further comprise: (h) transferring the pattern to a layer of the electronic device substrate below the patterned underlayer; and (i) removing the patterned underlayer.

It will be understood that when an element is referred to as being "on" or "over" another element, it can be directly adjacent to the other element or intervening elements may be present therebetween. In contrast, when an element is referred to as being "directly on" another element, there are no intervening elements present. As used herein, the term "and/or" includes any and all combinations of one or more of the associated listed items.

It will also be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; L=liter; mL=milliliter; Å=angstrom; nm=nanometer; μm=micron=micrometer; mm=millimeter; sec.=second; min.=minute; hr.=hour; DI=deionized; and Da=dalton. "wt %" refers to percent by weight based on the total weight of a referenced composition, unless otherwise specified.

Unless otherwise noted, "aliphatic", "aromatic", "alkyl", and "aryl" include heteroaliphatic, heteroaromatic, heteroalkyl and heteroaryl, respectively. The terms "heteroaliphatic", "heteroaromatic", "heteroalkyl", "heteroaryl", and the like, refer to aliphatic, aromatic, alkyl, and aryl, respectively, with one or more heteroatoms, such as nitrogen, oxygen, sulfur, phosphorus, or silicon, replacing one or more carbon atoms within the radical, for example, as in an ether or a thioether.

"Aliphatic" refers to open chain (linear, or branched) and cyclic aliphatic unless otherwise specified. Aliphatic structures may be saturated (e.g., alkanes) or unsaturated (e.g., alkenes or alkynes). Aliphatic refers to an aliphatic radical, and includes aliphatic monoradicals, diradicals, and higher-radicals. Unless otherwise noted, "Aliphatic" includes "heteroaliphatic". In a preferred aspect, the aliphatic radical does not include hetero atoms.

"Alkyl" refers to linear, branched and cyclic alkyl unless otherwise specified. As used herein, "alkyl" refers to an alkane radical, and includes alkane monoradicals, diradicals (alkylene), and higher-radicals. Unless otherwise noted, "alkyl" includes "heteroalkyl". In a preferred aspect, the alkyl radical does not include heteroatoms. If no number of carbons is indicated for any alkyl or heteroalkyl, then 1-12 carbons are contemplated.

"Aromatic" and "Aryl" include aromatic carbocycles and aromatic heterocycles. The terms "aromatic" and "aryl" refer to an aromatic radical, and includes monoradicals, diradicals (arylene), and higher-radicals. In a preferred aspect, the aromatic or aryl radical is an aromatic carbocycle.

Unless otherwise indicated, "substituted" refers to a moiety having one or more of its hydrogens replaced with one or more substituents chosen from halogen, $C_{1-6}$ alkyl, halo-$C_{1-6}$ alkyl, $C_{1-6}$ alkoxy, halo-$C_{1-6}$ alkoxy, phenyl, and phenoxy, preferably from halogen, $C_{1-6}$ alkyl, halo-$C_{1-4}$ alkyl, $C_{1-6}$ alkoxy, halo-$C_{1-4}$ alkoxy, and phenyl, and more preferably from halogen, $C_{1-6}$ alkyl, $C_{1-6}$ alkoxy, phenyl, and phenoxy. Unless otherwise specified, a substituted moiety preferably has from 1 to 3 substituents, and more preferably 1 or 2 substituents. "Halo" refers to fluoro, chloro, bromo, and iodo.

The term "B-staged" refers to a partially cured reaction product of the specified one or more compounds. As used herein, "partially cured" refers to a reaction product that is in oligomeric form and that can be further polymerized or cured to form higher molecular weight materials, such as useful when the coating composition is coated on a substrate and cured to form a layer or film of the composition. When such coating composition is coated on a substrate to form a film, such partially cured reaction product may undergo further curing during subsequent processing steps.

"Oligomer" and "oligomeric" refer to a low molecular weight polymer that includes a few, for example, from 2 to 10 total units and that are capable of further curing. As used herein, the term "polymer" includes oligomers. By the term "curing" is meant any process, such as polymerization or condensation, that increases the overall molecular weight of the materials, removes solubility enhancing groups, or both increases the overall molecular weight and removes solubility enhancing groups. "Curable" refers to any material capable of being cured under certain conditions. As used herein, "gap" refers to any aperture on a semiconductor substrate that is intended to be filled with a gap-filling composition.

The articles "a" and "an" refer to the singular and the plural. Unless otherwise noted, all amounts are percent by weight and all ratios are by weight. All numerical ranges are inclusive and combinable in any order, except where it is clear that such numerical ranges are constrained to add up to 100%.

DETAILED DESCRIPTION OF THE INVENTION

Coating compositions of the invention comprise a curable compound comprising: a core chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and three or more substituents of formula (1)

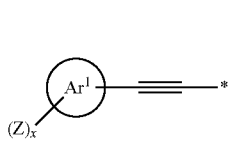

(1)

wherein at least two substituents of formula (1) are attached to the core; and wherein: $Ar^1$ is chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Z is a substituent independently chosen from $OR^1$, protected hydroxyl, carboxyl, protected carboxyl, $SR^1$, protected thiol, —O—C(=O)—$C_{1-6}$ alkyl, halogen, and $NHR^2$; wherein each $R^1$ is independently chosen from H, $C_{1-10}$ alkyl, $C_{2-10}$ unsaturated hydrocarbyl, and $C_{5-30}$ aryl; each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$—$R^1$; x is an integer from 1 to the total number of available aromatic ring atoms in $Ar^1$; and * denotes the point of attachment to the core; provided that no substituents of formula (1) are in an ortho position to each other on the same aromatic ring of the core. Thus, substituents of formula (1) bonded to the same aromatic ring of the core will not be bonded to immediately adjacent carbon atoms of the aromatic ring, for example, at positions 1 and 2 of a benzene core.

It is preferred that each Z is independently chosen from $OR^1$, protected hydroxyl, carboxyl, protected carboxyl, SH, —O—C(=O)—$C_{1-6}$ alkyl, and $NHR^2$. More preferably, each Z is independently chosen from hydroxyl, protected hydroxyl, $OCH_2C\equiv CH$, carboxyl, protected carboxyl, and $NHR^2$, yet more preferably from hydroxyl, protected hydroxyl, $OCH_2C\equiv CH$, carboxyl, and protected carboxyl, still more preferably from hydroxyl and protected hydroxyl, and most preferably hydroxyl. Each $R^1$ is independently chosen from H, $C_{1-10}$ alkyl, $C_{2-10}$ unsaturated hydrocarbyl, and $C_{5-30}$ aryl, and more preferably from H, $C_{1-10}$ alkyl, $C_{2-10}$ alkenyl, $C_{2-10}$ alkynyl, and $C_{5-30}$ aryl. In one preferred embodiment, $R^1$ is H. Each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$—$R^1$. Preferably, $R^2$ is chosen from H, $C_{1-10}$-alkyl, $C_{2-10}$-unsaturated hydrocarbyl, and $C_{5-30}$ aryl, and more preferably from H, $C_{1-10}$-alkyl, $C_{2-10}$-alkenyl and $C_{2-10}$-alkynyl.

As used herein, the term "core" refers to a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, to which at least two moieties, and preferably from two to six moieties, of formula (1) are attached. It is to be understood that in the compounds from which the curable compounds are formed, the cores described below (e.g., pyridine, benzene, etc.) are substituted with substituents of formula (1) and optional additional substituents as described above with reference to the definition of "substituted". For example, the compound below is to be understood as having a benzene core and 3 substituents of formula (1):

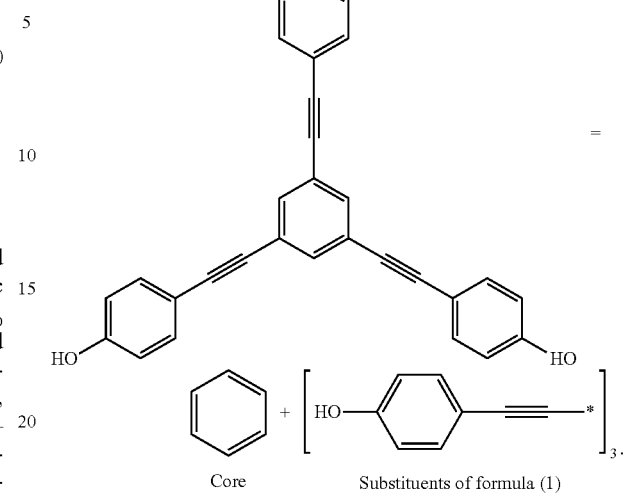

The core is preferably a $C_6$ carbocyclic aromatic ring, a $C_{2-5}$ heterocyclic aromatic ring, a $C_{9-30}$ fused carbocyclic aromatic ring system, or a $C_{4-30}$ fused heterocyclic aromatic ring system. Suitable aromatic cores include, for example, those chosen from pyridine, benzene, naphthalene, quinoline, isoquinoline, carbazole, anthracene, phenanthrene, pyrene, coronene, triphenylene, chrysene, phenalene, benz[a]anthracene, dibenz[a,h]anthracene, oxazole, isooxazole, thiazole, isothiazole, triazole and benzo[a]pyrene, more preferably from benzene, naphthalene, carbazole, anthracene, phenanthrene, pyrene, coronene, triphenylene, chrysene, phenalene, benz[a]anthracene, dibenz[a,h]anthracene, and benzo[a]pyrene, and still more preferably from benzene, naphthalene, anthracene, phenanthrene, pyrene, coronene, triphenylene, chrysene, and phenalene. The aliphatic cores may be substituted or unsubstituted, straight-chained, branched-chained or cyclic, and saturated or unsaturated (alkanes, alkenes or alkynes). Suitable aliphatic and heteroaliphatic cores include, for example, those chosen from methane, ethane, propane, butane, pentane, hexane, heptane, octane, nonane, decane, methylmethane, dimethylmethane, dimethylether, butene, butyne, dimethyl sulfide, trimethylamine, and tetramethylsilane, cyclopropane, cyclobutane, cyclopentane, cyclohexane, cycloheptane, cyclooctane, cyclononane, cyclodecane, cyclopropene, cyclobutene, cyclopentene, cyclohexene, cycloheptene, 1,3-cyclohexadiene, 1,4-cyclohexadiene, 1,5-cyclooctadiene, norbornene, adamantane, tetrahydropyran, tetrahydrothiophene, pyrrolidine, tetrahydro-2H-pyran, tetrahydro-2H-thiopyran, piperidine, and dioxane.

In formula (1), it is preferred that each $Ar^1$ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, more preferably from benzene, naphthalene, anthracene, phenanthrene, pyrene, coronene, triphenylene, chrysene, phenalene, benz[a]anthracene, dibenz[a,h]anthracene, and benzo[a]pyrene, and even more preferably from benzene, naphthalene, anthracene, phenanthrene, pyrene, coronene, triphenylene, chrysene, and phenalene. It is preferred that x=1 or 2, and more preferably x=1.

The curable compound has three or more substituents of formula (1), with two or more substituents of formula (1) being attached directly to the core. It is further preferred that the curable compound has from 2 to 4 substituents of formula (1) attached to the core, and more preferably there are three moieties of formula (1) attached to the core. One or more substituents of formula (1) may also be present in the curable compound but not attached directly to the core. The curable compound may have any suitable number of the moieties of formula (1) such as from 2 to 10, preferably from 2 to 8, more preferably from 2 to 6, and even more preferably 3 or 4. When the core comprises an aromatic ring, no substituents of formula (1) are in an ortho position to each other on the same aromatic ring of the core.

The curable compounds useful in the present coating compositions are preferably of formula (2)

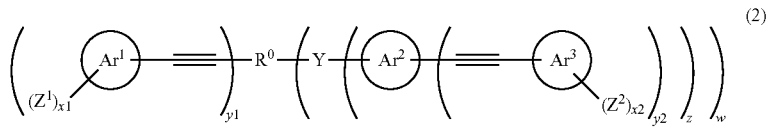

wherein: $R^0$ is a core as described above and is chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic; $Ar^1$, $Ar^2$, and $Ar^3$ are each independently an aromatic group independently chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Y is a single covalent chemical bond, a divalent linking group, or a trivalent linking group; $Z^1$ and $Z^2$ are independently chosen from $OR^1$, protected hydroxyl, carboxyl, protected carboxyl, $SR^1$, protected thiol, —O—C(=O)—$C_{1-6}$-alkyl, halogen, and $NHR^2$; each $R^1$ is chosen from H, $C_{1-10}$ alkyl, $C_{2-10}$ unsaturated hydrocarbyl, and $C_{5-30}$ aryl; each $R^2$ is chosen from H, $C_{1-10}$ alkyl, $C_{2-10}$ unsaturated hydrocarbyl, $C_{5-30}$ aryl, C(=O)—$R^1$, and S(=O)$_2$—$R^1$; x1=1 to 4; x2=1 to 4; y1=2 to 4; each y2=0 to 4; y1+each y2≥2; w=0 to 2; and z equals 0 to 2; wherein z=1 when Y is a single covalent chemical bond or a divalent linking group; and z=2 when Y is a trivalent linking group.

It is preferred that $R^0$ is an aromatic core having from 5 to 30 carbon atoms, and more preferably from 5 to 20 carbon atoms. Suitable aromatic cores for $R^0$ include, without limitation, pyridine, benzene, naphthalene, quinoline, isoquinoline, carbazole, anthracene, phenanthrene, pyrene, coronene, triphenylene, chrysene, phenalene, benz[a]anthracene, dibenz[a,h]anthracene, and benzo[a]pyrene, preferably benzene, naphthalene, carbazole, anthracene, phenanthrene, pyrene, coronene, triphenylene, chrysene, phenalene, benz[a]anthracene, dibenz[a,h]anthracene, and benzo[a]pyrene, and more preferably benzene, naphthalene, anthracene, phenanthrene, pyrene, coronene, triphenylene, chrysene, and phenalene. Suitable aliphatic cores include, for example, those chosen from methane, ethane, propane, butane, pentane, hexane, heptane, octane, nonane, decane, methylmethane, dimethylmethane, dimethylether, butene, butyne, dimethyl sulfide, trimethylamine, and tetramethylsilane. Suitable cycloaliphatic cores include, for example, those chosen from cyclopropane, cyclobutane, cyclopentane, cyclohexane, cycloheptane, cyclooctane, cyclononane, cyclodecane, cyclopropene, cyclobutene, cyclopentene, cyclohexene, cycloheptene, 1,3-cyclohexadiene, 1,4-cyclohexadiene, 1,5-cyclooctadiene, adamantane, tetrahydropyran, tetrahydrothiophene, pyrrolidine, tetrahydro-2H-pyran, tetrahydro-2H-thiopyran, piperidine, and dioxane.

Each of $Ar^1$, $Ar^2$, and $Ar^3$ are preferably independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, more preferably from benzene, naphthalene, anthracene, phenanthrene, pyrene, coronene, triphenylene, chrysene, phenalene, benz[a]anthracene, dibenz[a,h]anthracene, and benzo[a]pyrene, and yet more preferably from benzene, naphthalene, anthracene, phenanthrene, pyrene, coronene, triphenylene, chrysene, and phenalene. It is further preferred that $R^0$ is chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene, and each of $Ar^1$, $Ar^2$, and $Ar^3$ is independently chosen from pyridine, benzene, naphthalene, quinoline, isoquinoline, anthracene, phenanthrene, pyrene, coronene, triphenylene, chrysene, phenalene, benz[a]anthracene, dibenz[a,h]anthracene, and benzo[a]pyrene. It is preferred that each $Z^1$ and $Z^2$ are independently chosen from $OR^1$, protected hydroxyl, carboxyl (C(=O)OH), protected carboxyl, SH, fluorine, and $NHR^2$, more preferably from hydroxyl (OH), protected hydroxyl, OCH$_2$C≡CH, C(=O)OH, protected carboxyl, and $NHR^2$, yet more preferably from OH, protected hydroxyl, OCH$_2$C≡CH, carboxyl, and protected carboxyl, and still more preferably from OH and protected hydroxyl. Each $R^1$ is independently chosen from H, $C_{1-10}$ alkyl, $C_{2-10}$ unsaturated hydrocarbyl, and $C_{5-30}$ aryl, and more preferably from H, $C_{1-10}$-alkyl, $C_{2-10}$-alkenyl, $C_{2-10}$-alkynyl, and $C_{5-30}$ aryl. In one preferred embodiment, $R^1$ is H. Preferably, $R^2$ is chosen from H, $C_{1-10}$-alkyl, $C_{2-10}$-unsaturated hydrocarbyl, and $C_{5-30}$-aryl, and more preferably from H, $C_{1-10}$-alkyl, $C_{2-10}$-alkenyl, and $C_{2-10}$-alkynyl. It is preferred that each $Z^1$ is the same. It is also preferred that each $Z^2$ is the same. It is further preferred that $Z^1=Z^2$. It is preferred that each of x1 and x2 are independently chosen from 1 to 3, more preferably are independently 1 or 2, and yet more preferably are each 1. Preferably, each y2=0 to 2. It is preferred that y1+each y2=3 to 8, more preferably 3 to 6, and yet more preferably 3 or 4. Preferably, w=0 to 1. In one preferred embodiment, $R^0$ and each $Ar^1$ are not phenyl when w=0. In one preferred embodiment, Y is a single covalent bond. In another preferred embodiment, Y is a divalent or trivalent linking group. Exemplary linking groups for Y include, but are not limited to, O, S, $N(R^3)_r$, S(=O)$_2$, $CR^4R^5$, a bis-imide moiety, a bis-etherimide moiety, a bis-ketoimide moiety, a bis-benzoxazole moiety, a bis-benzimidazole moiety, and a bis-benzothiazole moiety, wherein r=0 or 1, and preferably linking groups for Y are O, $N(R^3)_w$, and $CR^4R^5$. $R^3$ is —C(=O)—$C_{5-30}$-aryl or —S(=O)$_2$—$C_{5-30}$-aryl, wherein ** is the point of attachment to N. $R^4$ and $R^5$ are independently chosen from H, $C_{1-10}$-alkyl and $C_{5-10}$-aryl, and $R^4$ and $R^4$ may be taken together along with the carbon to which they are attached to form a 5- or 6-membered ring which may be fused to one or more aromatic rings.

One suitable linking group when Y=CR⁴R⁵ is a fluorenyl moiety of the following formula (A)

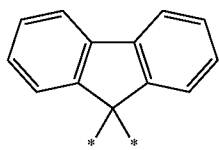

(A)

wherein * denotes the point of attachment to $R^O$ and $Ar^2$. A suitable bis-imide moiety linking group for Y is shown by formula (B) and formula (C) where $Y^1$ is a single covalent bond or a $C_{5-30}$-arylene, wherein * denotes the point of attachment to $R^O$ and $Ar^2$. Suitable bis-etherimide and bis-ketoimide moieties are those of formula (C) wherein $Y^1$=O or —C(=O)—, respectively, and wherein * denotes the point of attachment to $R^O$ and $Ar^2$. Suitable bis-benzoxazole, bis-benzimidazole, and bis-benzothiazole moieties are those of formula (D), wherein G=O, NH, and S, respectively, and wherein $Y^2$ is a single covalent bond or a $C_{5-30}$-arylene, and wherein * denotes the point of attachment to $R^O$ and $Ar^2$.

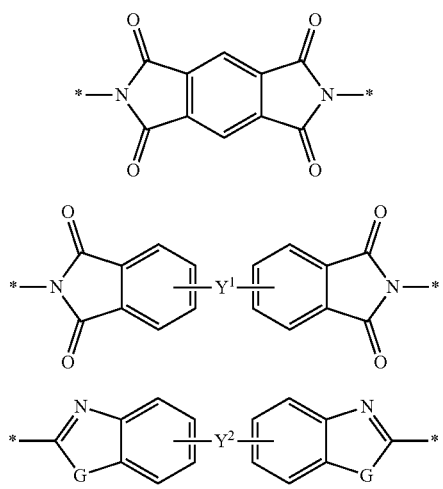

Protected carboxyl groups for Z, $Z^1$ and $Z^2$ of formulas (1) and (2) are any group which is cleavable (deprotectable) under certain conditions to yield a carboxyl group. Such protected carboxyl groups may be deprotected by heat, acid, base or a combination thereof, preferably by heat, acid or a combination thereof, and more preferably by heat. Exemplary protected carboxyl groups include esters, such as benzyl esters and esters having a quaternary carbon bonded directly to the alkoxy oxygen of the ester group. It is preferred that the protected carboxyl group is an ester having a quaternary carbon bonded directly to the alkoxy oxygen of the ester group, and more preferably the ester has the formula Y—C(O)—O—CR'R"R'", where Y is an organic residue, and each of R', R" and R'" are independently chosen from $C_{1-10}$ alkyl. Preferred protected carboxyl groups include: tert-butyl esters; 1-alkylcyclopentyl esters such as 1-methylcyclopentyl esters and 1-ethylcyclopentyl esters; 2,3-dimethyl-2-butyl esters; 3-methyl-3-pentyl esters; 2,3, 3-trimethyl-3-butyl esters; 1,2-dimethylcyclopentyl esters; 2,3,4-trimethyl-3-pentyl esters; 2,2,3,4,4-pentamethyl-3-pentyl esters; and adamantyl esters such as hydroxyadamantyl esters and $C_{1-12}$alkyladamantyl esters. Each of the aforementioned protected carboxyl groups can be deprotected by one or more of heat, acid or base. Preferably, the protected carboxyl groups are deprotected using heat, acid or a combination of heat and acid, and more preferably by heat. For example, these protected carboxyl groups can be deprotected at a pH of ≤4 and preferably ≤1. At such a pH, protected carboxyl groups are typically heated to a temperature for example, of from 90 to 110° C., and preferably approximately 100° C., to promote deprotection. Alternatively, when the protected carboxyl group is an ester having a tertiary carbon bonded directly to the alkoxy oxygen of the ester group, it can be deprotected by heating to a suitable temperature, such as ≥125° C., preferably from 125 to 250° C., and more preferably from 150 to 250° C. Such protected carboxyl groups, and their conditions of use, are well-known in the art. U.S. Pat. No. 6,136,501, for example, discloses various ester groups having a quaternary carbon bonded directly to the alkoxy oxygen of the ester group.

Protected hydroxyl groups suitable for Z, $Z^1$ and $Z^2$ of formulas (1) and (2) are any group which is cleavable (deprotectable) under certain conditions to yield a hydroxyl group. Such protected hydroxyl groups may be deprotected by heat, acid, base or a combination thereof. Exemplary protected hydroxyl groups include: ethers such as methoxymethyl ethers, ethoxy ethyl, ethers, 2-methoxypropyl ethers, tetrahydropyranyl ethers, tert-butyl ethers, allyl ethers, benzyl ethers, tert-butyldimethylsilyl ethers, tert-butyldiphenylsilyl ethers, acetonides, and benzylidene acetals; esters such as pivalic acid esters and benzoic acid esters; and carbonates such as tert-butylcarbonate. Each of the aforementioned protected hydroxyl groups can be deprotected under acidic or alkaline conditions, and preferably under acidic conditions. More preferably, the protected hydroxyl groups are deprotected using acid or a combination of acid and heat. For example, these protected hydroxyl groups can be deprotected at a pH of ≤4 and preferably ≤1. At such a pH, protected hydroxyl groups are typically heated to a temperature for example, of from 90 to 110° C., and preferably approximately 100° C., to promote deprotection. Such protected hydroxyl groups, and their conditions of use, are well-known in the art.

Protected thiol groups suitable for Z, $Z^1$ and $Z^2$ of formulas (1) and (2) are any group which is cleavable (deprotectable) under certain conditions to yield a thiol group. Such protected thiol groups may be cleaved by heat, acid, base or a combination thereof. Exemplary protected thiol groups include: ethers such as methoxymethyl thioethers, tetrahydropyranyl thioethers, tert-butyl thioethers, allyl thioethers, benzyl thioethers, tert-butyldimethylsilyl thioethers, tert-butyldiphenylsilyl thioethers, thioacetonides, and benzylidene thioacetals; thioesters such as pivalic acid thioesters and benzoic acid thioesters; and thiocarbonates such as tert-butylthiocarbonate. Each of the aforementioned protected thiol groups can be deprotected under acidic or alkaline conditions, and preferably under acidic conditions. More preferably, the protected thiol groups are deprotected using acid or a combination of acid and heat. For example, these protected thiol groups can be deprotected at room temperature, for example, when exposed to a pH of ≤1. At such a pH, protected thiol groups are typically heated to a temperature for example, of from 90 to 110° C., and preferably approximately 100° C., to promote deprotection. Such protected thiol groups, and their conditions of use, are well-known in the art.

The curable compound may be present in the coating compositions in a broad range, for example, from 1 to 99 wt %, from 10 to 99 wt %, or from 50 to 90 wt %, based on total solids of the coating composition. It may be desired that the curable compound is present in a relatively minor amount with respect to total solids of the composition, for example, from 1 to 50 wt % or from 1 to 30 wt %.

Curable compounds as described above can readily be made by persons skilled in the art using known synthesis techniques. For example, the compounds may be prepared by mixing reactants, for example, arylhalides or alkylhalides with aromatic alkynes, with suitable catalyst(s) such as a copper and palladium catalyst, base and solvent. The solvent is typically an organic solvent chosen, for example, from toluene, benzene, tetrahydrofuran, dioxane, and combinations thereof. Reaction is carried at a temperature and time effective to cause reaction of the reactants in the reaction mixture to form the curable compounds. The reaction temperature is typically from 0 to 200° C., preferably from 25 to 100° C. The reaction time is typically from 5 minutes to 96 hours, preferably from 2 to 24 hours. The product compounds can be purified by techniques known in the art such as column chromatography.

The coating compositions further comprise one or more polymers. Inclusion of a polymer in the coating compositions can allow for adjustment or improvement of one or more properties of the compositions or layers formed therefrom, for example, planarization performance, strip resistance, etch rate, or coating quality. Such properties may be tuned by selection of a suitable polymer and adjusting the relative amounts of the curable compound and polymer in the composition. Suitable polymers include, for example, those chosen from acrylates, vinyl aromatic polymers, novolacs, polyphenylenes, polyarylene ethers, polyimides, polybenzoxazoles, polybenzimidazoles, polybenzothiazoles, polyquinoxaline, polyetheresulfones, B-staged reaction products of the curable compounds described above, and combinations thereof. The polymers preferably include one or more functional groups chosen, for example, from hydroxy, alkoxy, epoxy, alkenyl, alkynyl, carboxylic acid, acetal, ketal, tertiary alkyl ester, and amine. Of these functional groups, epoxy is preferred. Suitable such polymers are known and can readily be made by persons skilled in the art using known synthesis techniques. Suitable polymers are described, for example, in: U.S. Pat. Nos. 5,349,111A, 5,965,679A, 7,303,855B2, 7,749,681B2, 8,674,052B2, 9,244,353B2, and 9,540,476B2; U.S. Patent App. Pub. Nos. 2008/0160460A1, 2013/0171569A1, 2013/0280913A1 and 2019/0146346A1; DW Smith et al, *Polyarylene Networks via Bergman Cyclopolymerization of Bis-ortho-diynyl Arenes*, Adv. Funct. Mater. 2007, 17, 1237-1246; G. Maier, *Polymers for Microelectronics*, Materials Today, Vol. 4, Issue 5, Sep.-Oct. 2001, 22-33; and PM Hergenrother, *The Use, Design, Synthesis, and Properties of High Performance High Temperature Polymers: an Overview*, High Performance Polymers, 15: 3-45, 2003, Sage Publications. Suitable polymers include, for example, homopolymers or copolymers comprising polymerized units of one or more of the following monomers, and may include polymerized units of other monomers:

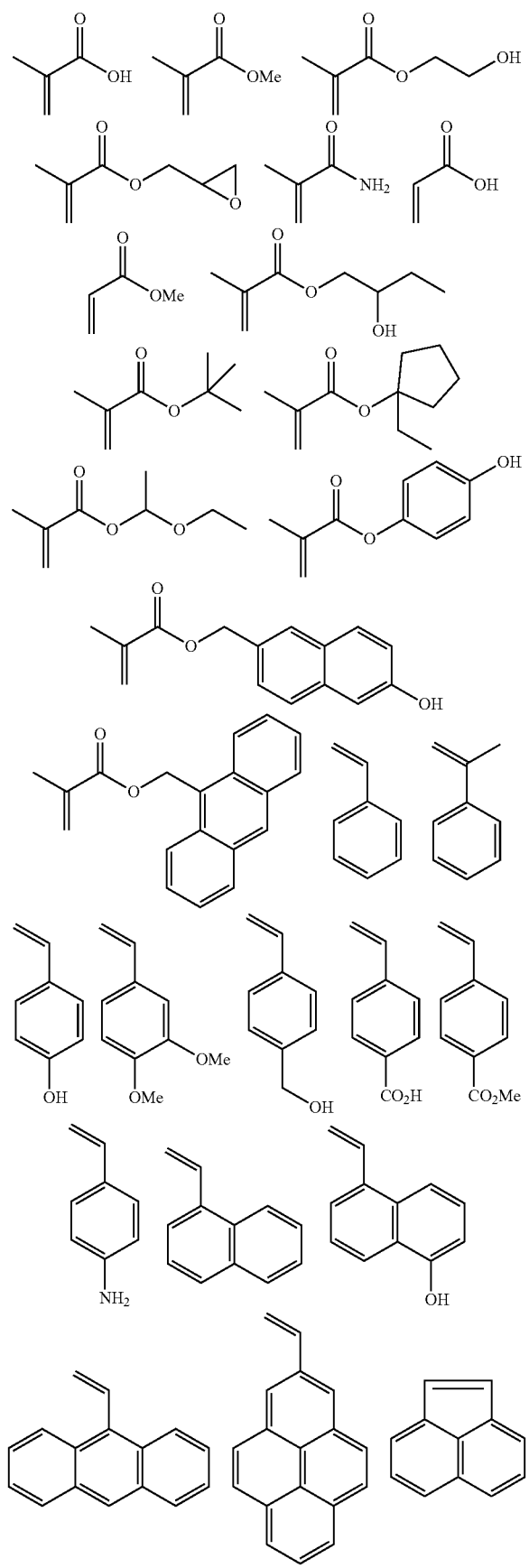

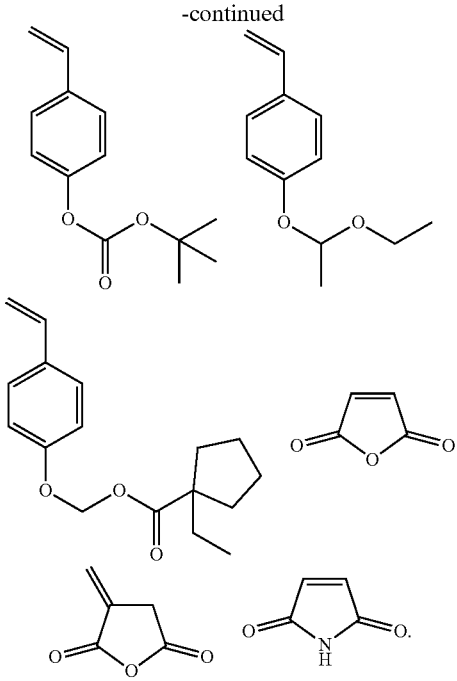

Suitable B-staged polymers include reaction products of a curable compound as described above. Thus, the coating composition may include in addition to the curable compound as described above, a B-staged reaction product of the same curable compound that is present in the composition or of a different such curable compound as described above. For example, the B-staged reaction product can be of a curable compound comprising a core chosen from a $C_6$ carbocyclic aromatic ring, a $C_{2-s}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and two or more substituents of formula (B-1) attached to the core:

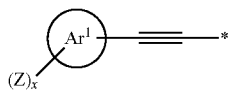
(B-1)

wherein in formula (B-1), $Ar^1$, Z, x and * are as defined above with respect to formula (1), and provided that no substituents of formula (B-1) are in an ortho position to each other on the same aromatic ring of the core. B-staged reaction products of the curable compounds can be prepared by methods known to those skilled in the art. For example, B-staging of the compounds may be conducted by dissolving the compound in a suitable solvent having a boiling point that is greater than the B-staging temperature.

Suitable solvents include, for example, those described below for the solvent component of the coating compositions. It may be desired to use the same solvent for B-staging as later used for the coating composition. The B-staging solvent is preferably chosen from propylene glycol methyl ether, propylene glycol ethyl ether, propylene glycol monomethyl ether acetate, ethyl lactate, gamma butyrolactone, methyl hydroxyisobutyrate, cyclohexanone, and combinations thereof. The solution is heated to a temperature for a time effective to cause partial polymerization or condensation of the compound until the target molecular weight is reached. B-stage reaction products of the above compounds typically have a weight average molecular weight (Mw) of from 400 to 50,000 Da, more preferably from 400 to 5,000 Da. The B-staging temperature is typically from 50 to 250° C., preferably from 100 to 200° C. The B-staging time is typically from 5 minutes to 96 hours, preferably from 2 to 24 hours. Known methods for forming B-staged polymers are described, for example, in U.S. Pat. No. 5,854,302 and in So, Y.-H et al, *Benzocyclobutene-based polymers for microelectronics*, Chemical Innovation, Vol. 31, No. 12, pp 40-47 (2001).

The one or more polymers are typically present individually or combined in an amount, for example, from 1 to 99 wt %, more typically from 5 to 90 wt %, based on total solids of the coating composition.

The coating compositions comprise one or more solvents for dissolving the components of the composition and facilitating its coating on a substrate. Preferably, the one or more solvents are chosen from organic solvents conventionally used in the manufacture of electronic devices. Suitable organic solvents include, but are not limited to: hydrocarbons such as xylene, mesitylene, cumene, and limonene; ketones such as cyclopentanone, cyclohexanone (CHO), methyl ethyl ketone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, diethylene glycol dimethyl ether, anisole, and ethoxybenzene; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, propylene glycol mono-tert-butyl ether acetate, benzyl propionate, cyclic or non-cyclic carbonate esters such as propylene carbonate, dimethyl carbonate, ethylene carbonate, and diphenyl carbonate; lactones such as gamma-butyrolactone (GBL); lactams such as N-methyl pyrrolidone; and any combination of the foregoing. Of these, preferred solvents are PGME, PGEE, PGMEA, EL, HBM, CHO, GBL, and combinations thereof. The total solvent content (i.e., cumulative solvent content for all solvents) in the coating compositions is from 50 to 99 wt %, typically from 80 to 99 wt %, and more typically from 90 to 99 wt %, based on the coating composition. The desired solvent content will depend, for example, on the desired thickness of the coated underlayer and coating conditions.

The coating compositions of the invention may optionally include one or more monomers, for example, one or more vinyl group-containing monomers chosen from (meth)acrylate monomers and vinyl aromatic monomers The one or more monomers may include one or more functional groups chosen, for example, from hydroxy, alkoxy, epoxy, alkenyl, alkynyl, carboxylic acid, acetal, ketal, tertiary alkyl ester, and amine. Of these functional groups, epoxy is particularly preferred. Such additive monomers, if present, may be present in the compositions in a broad range such as from 1 to 90 wt %, based on total solids of the coating composition.

The present coating compositions may also comprise one or more coating additives that are typically used in such coatings, such as curing agents, crosslinking agents, surface leveling agents, flow additives, and the like. The selection of such optional additives and their amounts are well within the ability of those skilled in the art. If used in the compositions, curing agents are typically present in an amount of from 1 to 20 wt %, and preferably from 1 to 3 wt % based on total solids. Crosslinking agents, if used, are typically present in an amount of from 1 to 30 wt %, and preferably from 3 to 10 wt %, based on total solids. Surface leveling agents, if used, are typically present in an amount of from 0.01 to 5 wt %, and preferably from 0.01 to 1 wt %, based on total solids. Flow additives, if used, are typically present in an amount of from 0.01 to 5 wt %, and preferably from 0.01 to 3 wt %, based on total solids. The selection of such optional additives and their amounts used are within the ability of those skilled in the art.

Curing agents may optionally be used in the coating compositions to aid in the curing of the composition after coating. A curing agent is any component which causes curing of the composition on the surface of the substrate. Preferred curing agents are acids and thermal acid generators. Suitable acids include, but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A thermal acid generator is any compound which liberates acid upon exposure to heat. Thermal acid generators are well-known in the art and are generally commercially available, such as from King Industries, Norwalk, Connecticut Exemplary thermal acid generators include, without limitation, amine blocked strong acids, such as amine blocked dodecylbenzenesulfonic acid. It will also be appreciated by those skilled in the art that certain photoacid generators are able to liberate acid upon heating and may function as thermal acid generators.

Any suitable crosslinking agent may be used in the present compositions, provided that such crosslinking agent has at least 2, and preferably at least 3, moieties capable of reacting with the present aromatic resin reaction products under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, and the like, and preferably any of the foregoing having 2 or more, preferably 3 or more, and more preferably 4, substituents selected from epoxy, methylol, $C_1$-$C_{10}$alkoxymethyl, and $C_2$-$C_{10}$acyloxymethyl. Suitable crosslinking agents are well-known in the art and are commercially available from a variety of sources. Examples of suitable crosslinking agents include those of formulas (3), (4), (5) and (6):

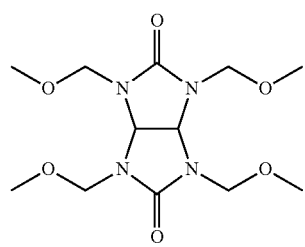

(3)

-continued

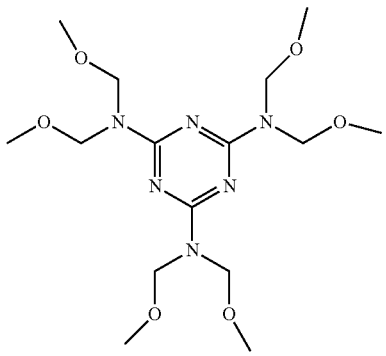

(4)

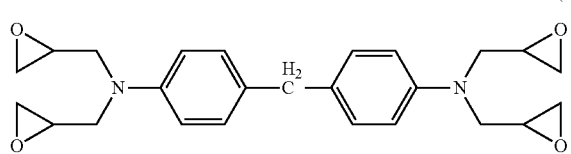

(5)

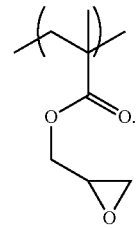

(6)

The present coating compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages.

The coating compositions of the invention and films formed therefrom can exhibit good gap-filling, surface planarization, solvent strip-resistance and film quality properties. The present compositions preferably substantially fill and more preferably fully fill a plurality of gaps in a semiconductor substrate. Preferably, the gaps are substantially or completely void-free.

Aromatic layers formed from the coating compositions described herein may be formed in the manufacture of electronic devices according to a method comprising: (a) providing an electronic device substrate; (b) coating a layer of a coating composition as described herein on a surface of the electronic device substrate; and (c) curing the layer of the curable compound to form a cured layer. The compositions find use in electronic device manufacturing as one or more of a photoresist underlayer, planarizing layer, gap-filling layer, or protective layer.

In an illustrative aspect of the invention, patterning methods using the coating compositions of the invention as a photoresist underlayer will be described. The methods comprises: (a) providing an electronic device substrate; (b) coating a layer of a coating composition as described herein on a surface of the electronic device substrate; (c) curing the layer of the curable compound to form an underlayer; (d) forming a photoresist layer over the underlayer; (e) patternwise exposing the photoresist layer to activating radiation;

(f) developing the exposed photoresist layer to form a pattern in the photoresist layer; and (g) transferring the pattern to the underlayer.

Suitable substrates on which the coating compositions can be coated include electronic device substrates. A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like, with semiconductor wafers being preferred. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more layers or structures which may optionally include active or operable portions of semiconductor devices. A semiconductor device refers to a semiconductor substrate upon which at least one microelectronic device has been or is being batch fabricated.

Optionally, a layer of an adhesion promoter may be applied to the substrate surface prior to coating of the present coating compositions. If an adhesion promoter is desired, any suitable adhesion promoter for polymer films may be used, such as silanes, preferably organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Industrial (Marlborough, Massachusetts).

The present coating compositions may be coated on the electronic device substrate by any suitable means, such as spin-coating, slot-die coating, doctor blading, curtain coating, roller coating, spray coating, dip coating, and the like. Of these, spin-coating is preferred. In a typical spin-coating method, the present compositions are applied to a substrate which is spinning at a rate of 500 to 4000 rpm for a period of 15 to 90 seconds to obtain a desired layer of the coating composition on the electronic device substrate. It will be appreciated by those skilled in the art that the height of the coating composition layer may be adjusted by changing the spin speed.

After being coated on the substrate, the coating composition layer is optionally baked at a relatively low temperature to remove any organic solvent and other relatively volatile components from the layer. Typically, the substrate is baked at a temperature of 80 to 150° C., although other suitable temperatures may be used. The baking time is typically from 10 seconds to 10 minutes, and preferably from 30 seconds to 5 minutes, although longer or shorter times may be used. When the substrate is a wafer, such baking step may be performed by heating the wafer on a hot plate. Following solvent removal, a layer, film or coating of the curable compound on the substrate surface is obtained.

The curable compound layer is then sufficiently cured to form an aromatic underlayer at conditions such that the film does not intermix with a subsequently applied coating layer, for example, a photoresist or other layer coated directly on the aromatic underlayer, while still maintaining the desired antireflective properties (n and k values) and etch selectivity of the underlayer film. The underlayer may be cured in an oxygen-containing atmosphere, such as air, or in an inert atmosphere, such as nitrogen, and preferably in an oxygen-containing atmosphere. This curing step is preferably conducted on a hot plate-style apparatus, though oven curing may be used. Typically, such curing is performed by heating the underlayer at a curing temperature of ≥150° C., preferably ≥170° C., and more preferably ≥200° C. The curing temperature and time selected should be sufficient to cure the aromatic underlayer. A suitable temperature rage for curing the aromatic underlayer is 150 to 400° C., preferably from 170 to 350° C., and more preferably from 200 to 250° C. Such curing step may take from 10 sec. to 10 min., preferably from 1 to 3 min., and more preferably from 1 to 2 min., although other suitable times may be used.

The initial baking step may not be necessary if the curing step is conducted in such a way that rapid evolution of the solvents and curing by-products are not allowed to disrupt the underlayer film quality. For example, a ramped bake beginning at relatively low temperatures and then gradually increasing to a temperature of ≥200° C. can give acceptable results. It can be preferable in some cases to use a multi-stage curing process, for example, a two-stage process with the first stage being a lower bake temperature of less than 150° C., and the second stage being a higher bake temperature of ≥200° C. Multi-stage curing processes can facilitate uniform filling and planarization of pre-existing substrate surface topography, for example filling of trenches and vias.

After curing of the underlayer, one or more processing layers, such as photoresists, silicon-containing layers, hardmask layers, bottom antireflective coating (or BARC) layers, and the like, may be coated on the cured underlayer. For example, a photoresist may be coated, such as by spin-coating, directly on the surface of a silicon-containing layer or other middle layer which is directly on the resin underlayer, or, alternatively, the photoresist may be coated directly on the cured underlayer. A wide variety of photoresists may be suitably used, such as those used in 193 nm lithography, such as those sold under the EPIC™ brand available from DuPont Electronics & Industrial (Marlborough, Massachusetts). Suitable photoresists may be of either positive- or negative-type. Following coating, the photoresist layer is then imaged (exposed) using patterned activating radiation, and the exposed photoresist layer is then developed using the appropriate developer to provide a patterned photoresist layer. References herein to exposing a photoresist layer to radiation that is activating indicates that the radiation is capable of forming a latent image in the photoresist layer. The photoresist layer may be exposed to the activating radiation through a patterned photomask having optically opaque and optically transparent regions, or by direct writing. The pattern is next transferred from the photoresist layer to the underlayer by an appropriate etching technique. Typically, the photoresist is also removed during such etching step. Next, the pattern is transferred to the substrate and the underlayer is removed by appropriate etching techniques known in the art, such as by plasma etching. Following patterning of the substrate, the underlayer is removed using conventional techniques. The electronic device substrate is then processed according to conventional means.

The cured underlayer may be used as the bottom layer of a multilayer resist process. In such a process, a layer of the coating composition is coated on a substrate and cured as described above. Next, one or more middle layers are coated on the aromatic underlayer. For example, a silicon-containing layer or a hardmask layer may be coated directly on the aromatic underlayer. Exemplary silicon-containing layers, such as a silicon-BARC, may be deposited by spin-coating on the underlayer followed by curing, or an inorganic silicon layer such as SiON or SiO may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is coated directly on the silicon-containing layer (in a trilayer process) or directly on the organic BARC layer (in a quadlayer process). The photoresist layer is then imaged (exposed) using patterned activating radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching. This results in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic underlayer is then patterned using appropriate etching techniques, such as $O_2$ or $CF_4$ plasma. Any remaining patterned photoresist and organic BARC layers are removed during etching of the aromatic underlayer. Next, the pattern is transferred to the substrate, such as by appropriate etching techniques, which also removes any remaining silicon-containing layer or hardmask layer, followed by removal of any remaining patterned aromatic underlayer to provide a patterned substrate.

The cured underlayer of the present invention may also be used in a self-aligned double patterning process. In such a process, a layer of the present coating composition is coated on a substrate, preferably by spin-coating. Any remaining organic solvent is removed and the coating composition layer is cured to form a cured underlayer. A suitable middle layer, such as a silicon-containing layer is coated on the cured underlayer. A layer of a suitable photoresist is then coated on the middle layer, such as by spin-coating. The photoresist layer is then patternwise imaged (exposed) with activating radiation, and the exposed photoresist layer is then developed using the appropriate developer to provide a patterned photoresist layer. The pattern is next transferred from the photoresist layer to the middle layer and the cured underlayer by appropriate etching techniques to expose portions of the substrate. Typically, the photoresist is also removed during such etching step. Next, a conformal silicon-containing layer is disposed over the patterned cured underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern. That is, such silicon-containing layer substantially covers the sides and top of the patterned underlayer. Next, the silicon-containing layer is partially etched (trimmed) to expose a top surface of the patterned polyarylene resin underlayer and a portion of the substrate. Following this partial etching step, the pattern on the substrate comprises a plurality of features, each feature comprising a line or post of the cured underlayer with the silicon-containing layer directly adjacent to the sides of each cured underlayer feature, also referred to as a sidewall spacer. Next, the cured underlayer is removed, such as by etching, to expose the substrate surface that was under the cured underlayer pattern, and providing a patterned silicon-containing layer on the substrate surface, where such patterned silicon-containing layer is doubled (that is, twice as many lines and/or posts) as compared to the patterned cured underlayer.

In addition to their use in forming photoresist underlayers and patterns as described above, the coating compositions of the invention are useful in forming planarizing layers, gap-filling layers, and protective layers in the manufacture of integrated circuits. When used as such layers, one or more intervening material layers, such as silicon-containing layers, other aromatic resin layers, hardmask layers, or the like, are typically present between the cured layer of the present coating composition and any photoresist layer. Typically, such planarizing layers, gap-filling layers, and protective layers are ultimately patterned.

The following non-limiting examples are illustrative of the invention.

EXAMPLES

Synthesis Examples

Synthesis Example A

4-Iodophenyl acetate (24.75 g), cuprous iodide (0.17 g) and triethylamine (27.32 g) were added to 22.82 g of 1,4-dioxane at room temperature. The reaction mixture was purged with nitrogen for 1 hour. Bis(triphenylphosphine) palladium(II) chloride (0.63 g) was added to the reaction mixture, and the mixture was heated to 70° C. A solution of 1,3,5-triethynylbenzene (4.5 g) in degassed 1,4-dioxane (20 g) was then slowly added to the reaction mixture by syringe pump. After completion of addition, the reaction mixture was stirred overnight at 70° C. under nitrogen. After the reaction was completed, the reaction mixture was cooled to room temperature, and solvents were evaporated. The residue was diluted with ethyl acetate and filtered to remove the solid. The solution was evaporated, and the residue was purified by column chromatography to give a light yellow solid. The obtained solid was then dissolved in THF (38 g) under nitrogen. Lithium hydroxide monohydrate (3.81 g) and water (16 g) were added, and the mixture was stirred at 60° C. for 1 hour. The mixture was then cooled to room temperature, and the solvent was removed. The residue was diluted with ethyl acetate and water, and then treated with hydrochloric acid until the pH of the aqueous layer was 1. The organic phase was separated and the aqueous phase was extracted with ethyl acetate. The organic layers were combined, and washed with water. The solvent was removed under vacuum, and the residue was purified by column chromatography to obtain 1,3,5-tris((4-hydroxyphenyl)ethynyl)benzene as a light yellow solid (7.7 g, 61% yield). The reaction is shown in Reaction Scheme 1.

Reaction Scheme 1

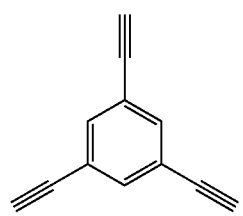

+

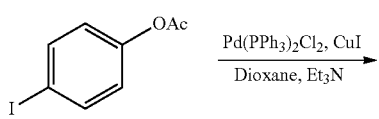

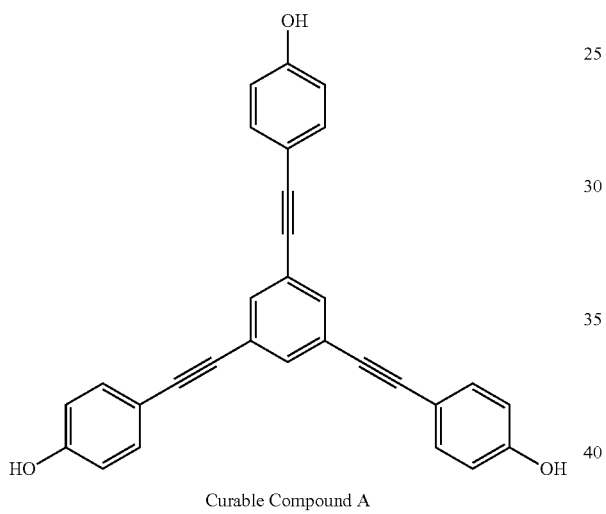

Curable Compound A

Synthesis Example B 5,5'-Oxybis(1,3-dibromobenzene) (3.61 g), cuprous iodide (0.21 g) and triethylamine (3.42 g) were added to 20 g of 1,4-dioxane at room temperature. The reaction mixture was purged with nitrogen for 1 hr. Bis(triphenylphosphine) palladium(II) chloride (0.53 g) was added to the reaction mixture, and the mixture was heated to 70° C. 4-Ethynylphenyl acetate (4.81 g) was dissolved in degassed 1,4-dioxane (17 g), and the solution was then slowly added to reaction mixture by way of an addition funnel. After completion of addition, the reaction mixture was stirred overnight at 70° C. under nitrogen. After the reaction was completed, the reaction mixture was cooled to room temperature, filtered and solvents were evaporated. The residue was purified by chromatography to give a light yellow solid. This obtained solid was then dissolved in THF (40 g) under nitrogen. Lithium hydroxide monohydrate (1.26 g) and water (10 g) were added, and the mixture was stirred at 60° C. for 1 hr. The reaction mixture was then diluted with ethyl acetate and then treated with hydrochloric acid until the pH of the aqueous layer was 1. The organic phase was separated and the aqueous phase was extracted with ethyl acetate. The organic layers were combined, and washed with water. The solvent was removed under vacuum, and the residue was purified by column chromatography to give 5,5'-oxybis(1,3-di((4-hydroxyphenyl)ethynyl)benzene) as a light yellow solid, 3.1 g (65% yield). The reaction is shown in Reaction Scheme 2.

Reaction Scheme 2

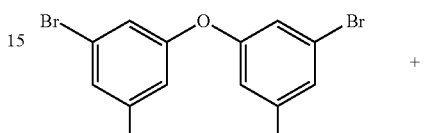

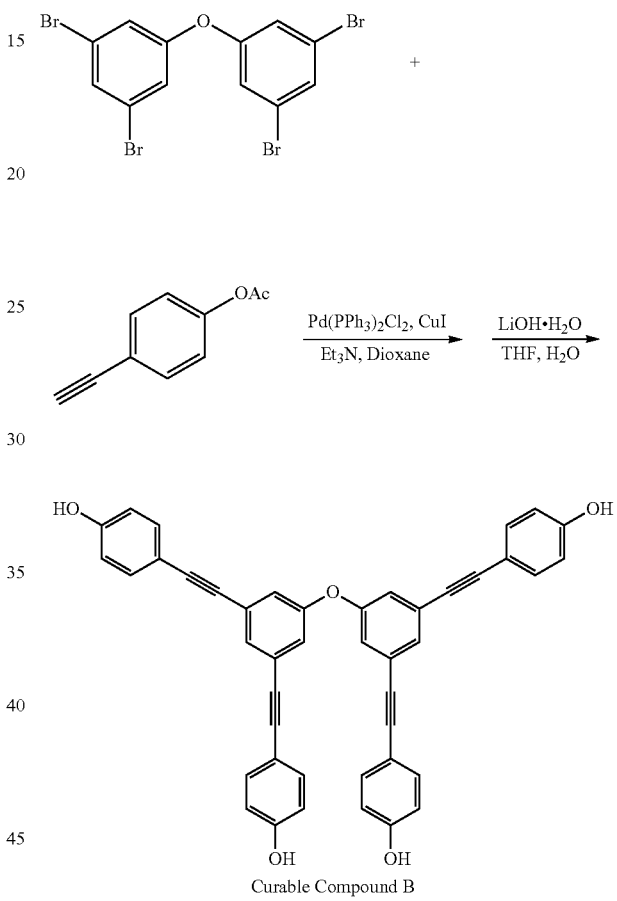

Curable Compound B

Synthesis Example C 1,3,5-tris((4-hydroxyphenyl)ethynyl)benzene (6.0 g) in anhydrous DMF (46 g) was stirred at room temperature for 15 minutes. The mixture was heated to 30° C. and $K_2CO_3$ (10.34 g) was then added. The reaction mixture was heated to 50° C. and 8.63 g propargyl bromide (80% in toluene) solution was added dropwise by addition funnel. The temperature was maintained at 50° C. for 24 hours. The reaction mixture was then allowed to cool to room temperature and was filtered to remove most of the $K_2CO_3$. The organics were precipitated into 2 L water and stirred at room temperature for 0.5 hour. The precipitated polymer was collected by filtration to provide a light yellow solid product (5.8 g, 76% yield). The reaction is shown in Reaction Scheme 3.

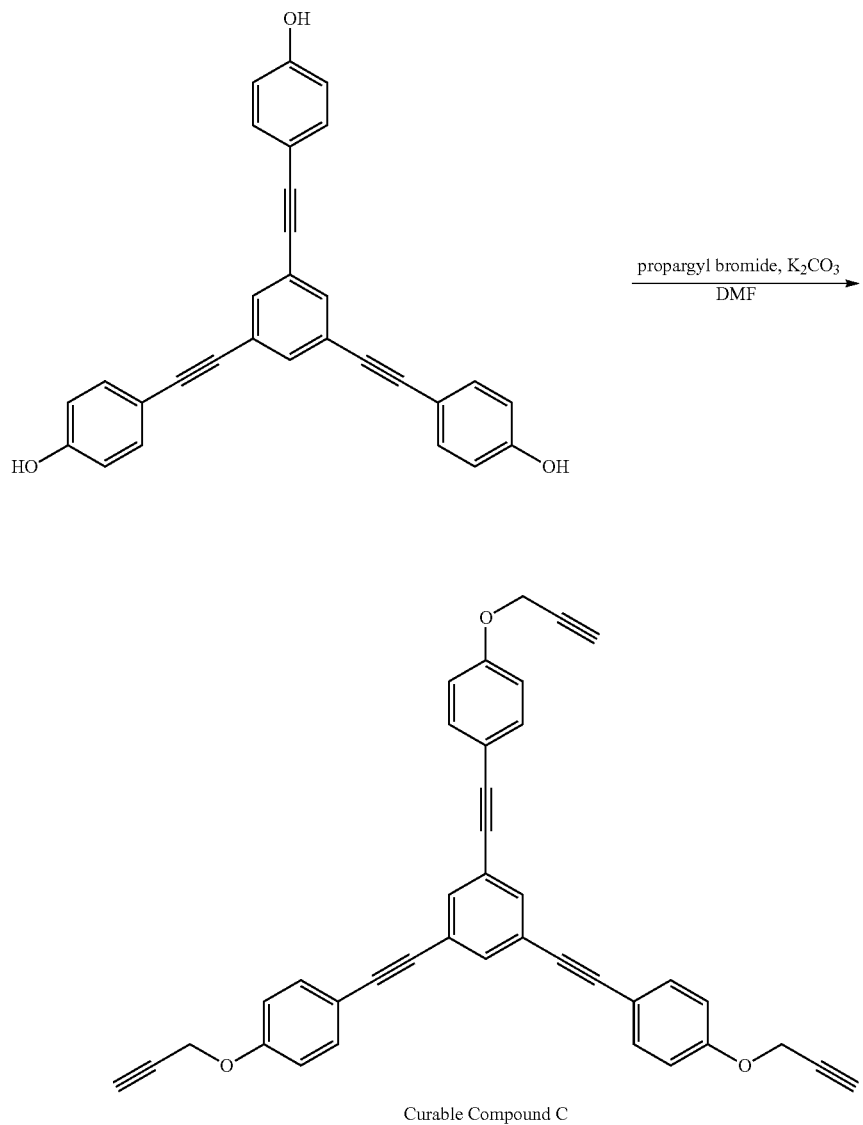

Reaction Scheme 3

Curable Compound C

Synthesis Example D

A three-necked 50 mL round-bottom flask was equipped with a mechanical stirrer, a thermowell, and a condenser with nitrogen inlet. The flask was charged with 1-pyrenol (10.0 g), 2-naphthaldehyde (7.2 g), and PGME (40 mL). The reaction mixture was then stirred at room temperature under nitrogen. A clear solution was obtained after 30 minutes and methanesulfonic acid (2.2 g) was added to the reaction mixture. The reaction mixture was heated to 120° C. for 4 hours to provide a thick solution. The reaction mixture was then cooled to room temperature. The mixture was added to 400 mL methanol and water (v/v=4/1), resulting in a grey precipitate. The precipitated resin was filtered with a Buchner funnel and vacuum-dried at 70° C. to give a resin as a grey solid (11.3 g, Mw=1229). The reaction is shown in Reaction Scheme 4.

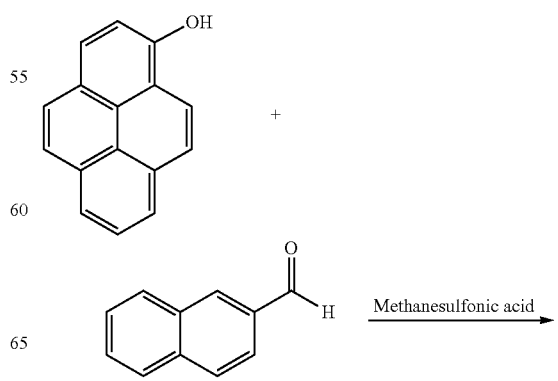

Reaction Scheme 4

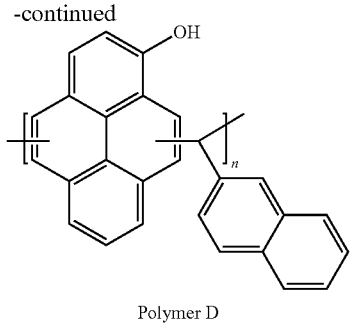

Polymer D

Synthesis Example E 1,3,5-tris((4-hydroxyphenyl)ethynyl)benzene (Curable Compound A) (50 g) and PGMEA (72 g) were added to a 250 mL round-bottom flask. The flask was charged with nitrogen, and the reaction mixture was stirred at room temperature until all of the solid was dissolved. The solution was then heated to 140° C. The mixture was cooled to room temperature and diluted with PGMEA (45 g). The resulting solution was then filtered through a 0.2 micron PTFE filter resulting in B-staged material E (Mw=1550). The reaction is shown in Reaction Scheme 5.

Reaction Scheme 5

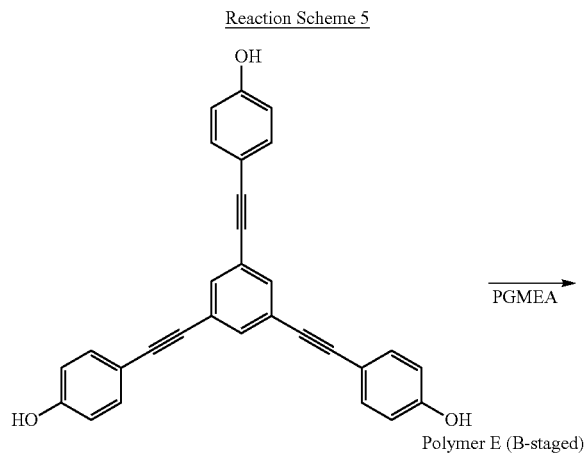

Polymer E (B-staged)

Synthesis Example F

A mixture of 30.0 g of 3,3'-(oxydi-1,4-phenylene)bis(2,4,5-triphenylcyclopentadienone), 18.1 g 1,3,5-tris(phenylethynyl)benzene and 102.2 g of gamma-butyrolactone was heated at 185° C. for 14 hours. The reaction was then allowed to cool to room temp and diluted with 21.5 grams of GBL. The crude reaction mixture was added to 1.7 L of a 1:1 mixture of IPA/PGME and stirred for 30 minutes. The solid was collected by vacuum filtration and washed with 1:1 mixture of IPA/PGME. To the solid was added 0.4 L of water and the slurry was heated to 50° C. and stirred at 50° C. for 30 minutes. The warm slurry was filtered by vacuum filtration. The wet cake was vacuum dried for 2 days at 70° C. resulting in a polymer (34.1 g, 71% yield, Mw=3588, PDI=1.38). The reaction is shown in Reaction Scheme 6.

Reaction Scheme 6

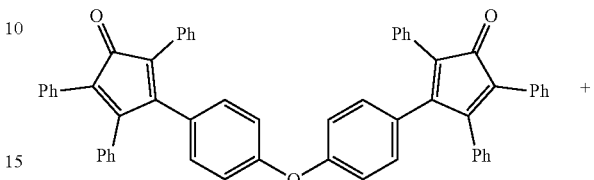

Polymer F

Underlayer Composition Preparation

Examples 1-26

Materials as prepared in the synthesis examples, inclusive of any added solvent, were added to a mixture of PGMEA/benzyl benzoate (97/3 by weight after addition of the polymers and comparative material compositions) to form solutions having about 5 wt % total solids. Other components, if any, were combined with the solutions to provide underlayer composition formulations having the components in the relative amounts described in Table 1.

TABLE 1

| Example | Underlayer Composition | Curable Compound | Solvent | Polymer | Crosslinker |
|---|---|---|---|---|---|
| 1 | UC-1 | A (1.485) | PB (95.0) | D (3.465) | MF (0.05) |
| 2 | UC-2 | A (0.925) | PB (95.0) | D (3.700) | HM (0.375) |
| 3 | UC-3 | B (0.925) | PB (95.0) | D (3.700) | HM (0.375) |
| 4 | UC-4 | A (0.925) | PB (95.0) | S275 (3.7) | HM (0.375) |

TABLE 1-continued

| Example | Underlayer Composition | Curable Compound | Solvent | Polymer | Crosslinker |
|---|---|---|---|---|---|
| 5 | UC-5 | B (0.925) | PB (95.0) | S275 (3.7) | HM (0.375) |
| 6 | UC-6 | A (1.0) | PB (95.0) | PHS (4.0) | — |
| 7 | UC-7 | A (0.925) | PB (95.0) | PHS (3.7) | HM |
| 8 | UC-8 | A (1.0) | PB (95.0) | MA (4.0) | — |
| 9 | UC-9 | A (0.925) | PB (95.0) | GMA (3.7) | HM |
| 10 | UC-10 | A (1.0) | PB (95.0) | GMA (4.0) | — |
| 11 | UC-11 | A (2.0) | PB (95.0) | GMA (3.0) | — |
| 12 | UC-12 | A (3.0) | PB (95.0) | GMA (2.0) | — |
| 13 | UC-13 | A (4.0) | PB (95.0) | GMA (1.0) | — |
| 14 | UC-14 | A (1.0) | PB (95.0) | E (4.0) | — |
| 15 | UC-15 | A (2.0) | PB (95.0) | E (3.0) | — |
| 16 | UC-16 | A (3.0) | PB (95.0) | E (2.0) | — |
| 17 | UC-17 | C (1.5) | PB (95.0) | F (3.5) | — |
| 18 (Comp) | UC-18 | — | PB (95.0) | D (4.95) | MF (0.05) |
| 19 (Comp) | UC-19 | — | PB (95.0) | D (4.625) | HM (0.375) |
| 20 (Comp) | UC-20 | — | PB (95.0) | S275 (4.625) | HM (0.375) |
| 21 (Comp) | UC-21 | — | PB (95.0) | PHS (5.0) | — |
| 22 (Comp) | UC-22 | — | PB (95.0) | PHS (4.625) | HM (0.375) |
| 23 (Comp) | UC-23 | — | PB (95.0) | MA (5.0) | — |
| 24 (Comp) | UC-24 | — | PB (95.0) | GMA (4.625) | HM (0.375) |
| 25 (Comp) | UC-25 | — | PB (95.0) | GMA (5.0) | — |
| 26 (Comp) | UC-26 | — | PB (95.0) | F (5.0) | — |

*Content of curable compound, polymer and other solid materials is exclusive of solvent; GMA = Poly-Glycidyl methacrylate (Miwon Commercial Co., Ltd.); MF = MODAFLOW acrylic resin (Allnex Netherlands B.V.); HM = hexakis(methoxymethyl)melamine (Nihon Cytec Industries Inc.); S275 = 1-naphthol/formaldehyde novolac polymer (Gun-Ei chemical); PHS = poly(4-hydroxy styrene) Mw 5000 (Toyota Tsusho America, Inc.); MA = copolymer of Hydroxyethylmethacrylate/Methyl methacrylate 40/60 (St. Jean Photochemicals); PB = PGMEA/benzyl benzoate (97/3 by weight after addition of the material and comparative material compositions); numerical values for components are wt % solids based on total underlayer composition.

Solvent Strip Resistance Evaluation

Examples 27-52

Each composition was spin-coated onto a respective 200 mm silicon wafer on an ACT-8 Clean Track (Tokyo Electron Co.) at 1500 rpm, and then cured at the temperature and time set forth in Table 2 to form a film. Initial film thickness was measured with a Therma-Wave OptiProbe™ metrology tool. PGMEA remover was then applied to each of the films for 90 seconds followed by a post-strip bake at 105° C. for 60 seconds. The thickness of each film was again measured to determine the amount of film thickness lost. The difference in film thickness before and after contact with the PGMEA remover is set forth in Table 2 as the percentage of film thickness remaining on the wafer (% Film Remaining). This value is indicative of the degree of crosslinking of the polymeric layer.

TABLE 2

| Example | Underlayer Composition | Cure Temp/Time | % Film Remaining |
|---|---|---|---|
| 27 | UC-1 | 350° C./60 s | >99% |
| 28 | UC-2 | 300° C./60 s | >99% |
| 29 | UC-3 | 300° C./60 s | >99% |
| 30 | UC-4 | 240° C./60 s | >99% |
| 31 | UC-5 | 240° C./60 s | >99% |
| 32 | UC-6 | 300° C./60 s | >99% |
| 33 | UC-7 | 240° C./60 s | >99% |
| 34 | UC-8 | 300° C./60 s | 95% |
| 35 | UC-9 | 240° C./60 s | >99% |
| 36 | UC-10 | 220° C./60 s | >99% |
| 37 | UC-11 | 220° C./60 s | >99% |
| 38 | UC-12 | 220° C./60 s | >99% |
| 39 | UC-13 | 220° C./60 s | 86% |
| 40 | UC-14 | 220° C./60 s | >99% |
| 41 | UC-15 | 220° C./60 s | >99% |
| 42 | UC-16 | 220° C./60 s | >99% |
| 43 | UC-17 | 350° C./90 s | >99% |
| 44 (Comp) | UC-18 | 350° C./60 s | 85% |
| 45 (Comp) | UC-19 | 300° C./60 s | 64% |
| 46 (Comp) | UC-20 | 240° C./60 s | >99% |
| 47 (Comp) | UC-21 | 300° C./60 s | 3% |
| 48 (Comp) | UC-22 | 240° C./60 s | 89% |
| 49 (Comp) | UC-23 | 300° C./60 s | 5% |
| 50 (Comp) | UC-24 | 240° C./60 s | 4% |
| 51 (Comp) | UC-25 | 220° C./60 s | <5% |
| 52 (Comp) | UC-26 | 350° C./90 s | <10% |

Gap-Fill and Planarization Evaluation

Examples 53-67

300 mm silicon wafers having various patterned features were used to evaluate gap-fill and planarization performance of the underlayer compositions. The features were formed in a 100 nm-thick PECVD silicon oxide layer coated on the wafers. Prior to coating the compositions, the wafers underwent a dehydration bake at 150° C. for 60 seconds. The compositions were each coated on a respective wafer with an ACT-8 Clean Track (Tokyo Electron Co.) at 1300-1700 rpm to achieve a target film thickness after curing of approximately 100 nm. The coated compositions were cured by placing the wafers on a hot plate at the temperature and time conditions in Table 3. Cross-sectional images were taken on a Hitachi High Technology S4800 CD-SEM.

Gap-fill performance was evaluated using the SEM images by visual inspection of 45 nm 1:1 (90 nm-pitch) line/space patterns overcoated with the underlayer. Gap-fill performance was deemed to be good if no voids or bubbles were observed. Planarization performance of the underlayer compositions was evaluated using a trench pattern (2 micron-width space defined between 3 micron-width lines) overcoated with the underlayer. A KLA Tencor P-7 stylus profilometer measured the height difference of the underlayer between maximum height (over trench line pattern) and minimum height (over trench space). Underlayers having a height difference of 260 Å or less were considered to have good planarization and films having a height difference greater than 260 Å were considered to have poor planarization. The results are set forth in Table 3.

TABLE 3

| Example | Underlayer Composition | Cure Temp/ Time | Gap Fill | Planarization |
|---|---|---|---|---|
| 53 | UC-1 | 350° C./60 s. | Good | Good |
| 54 | UC-6 | 300° C./60 s. | Good | Good |
| 55 | UC-7 | 240° C./60 s. | Good | Good |
| 56 | UC-8 | 300° C./60 s. | Good | Good |
| 57 | UC-9 | 240° C./60 s. | Good | Good |
| 58 | UC-10 | 220° C./60 s. | Good | Good |
| 59 | UC-11 | 220° C./60 s. | Good | Good |
| 60 | UC-14 | 220° C./60 s. | Good | Good |
| 61 | UC-15 | 220° C./60 s. | Good | Good |
| 62 | UC-16 | 220° C./60 s. | Good | Good |
| 63 | UC-17 | 350° C./90 s. | Good | Good |
| 64 (Comp) | UC-18 | 350° C./60 s. | Good | Poor |
| 65 (Comp) | UC-19 | 300° C./60 s. | Good | Poor |
| 66 (Comp) | UC-20 | 240° C./60 s. | Good | Poor |
| 67 (Comp) | UC-26 | 350° C./90 s. | Good | Poor |

Coating Quality Evaluation

Examples 68-89

Underlayer compositions were each spin-coated onto a respective 200 mm silicon wafer on an ACT-8 Clean Track (Tokyo Electron Co.) at 1500 rpm, and then cured at the temperature and time conditions in Table 4 to form an underlayer film. Coating quality was evaluated by visually inspecting the films by both eye and optical microscope. Coating quality was judged to be of poor quality if any striation or dewetting was observed, and of good quality in their absence. The results are reported in Table 4.

TABLE 4

| Example | Underlayer Composition | Cure Temp/ Time | Coating Quality |
|---|---|---|---|
| 68 | UC-1 | 350° C./60 s | Good |
| 69 | UC-2 | 300° C./60 s | Good |
| 70 | UC-3 | 300° C./60 s | Good |
| 71 | UC-4 | 240° C./60 s | Good |
| 72 | UC-5 | 240° C./60 s | Good |
| 73 | UC-6 | 300° C./60 s | Good |
| 74 | UC-7 | 240° C./60 s | Good |
| 75 | UC-8 | 300° C./60 s | Good |
| 76 | UC-9 | 240° C./60 s | Good |
| 77 | UC-14 | 220° C./60 s. | Good |
| 78 | UC-15 | 220° C./60 s. | Good |
| 79 | UC-16 | 220° C./60 s. | Good |
| 80 | UC-17 | 350° C./90 s | Good |
| 81 (Comp) | UC-18 | 350° C./60 s | Good |
| 82 (Comp) | UC-19 | 300° C./60 s | Good |
| 83 (Comp) | UC-20 | 240° C./60 s | Good |
| 84 (Comp) | UC-21 | 300° C./60 s | Good |
| 85 (Comp) | UC-22 | 240° C./60 s | Good |
| 86 (Comp) | UC-23 | 300° C./60 s | Good |
| 87 (Comp) | UC-24 | 240° C./60 s | Good |
| 88 (Comp) | UC-25 | 220° C./60 s | Good |
| 89 (Comp) | UC-26 | 350° C./90 s | Good |

What is claimed is:
1. A coating composition, comprising:
a first curable compound comprising: a core chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and three or more substituents of formula (1)

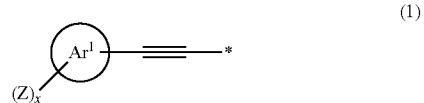

(1)

wherein at least two substituents of formula (1) are attached to the core, wherein the core is optionally further substituted; and wherein: $Ar^1$ is chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Z is a substituent independently chosen from $OR^1$, protected hydroxyl, carboxyl, protected carboxyl, $SR^1$, protected thiol, —O—C(=O)—$C_{1-6}$ alkyl, halogen, and $NHR^2$ wherein each $R^1$ is independently chosen from H, $C_{1-10}$ alkyl, $C_{2-10}$ unsaturated hydrocarbyl, and $C_{5-30}$ aryl; each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$-$R^1$; x is an integer from 1 to the total number of available aromatic ring atoms in $Ar^1$; and * denotes the point of attachment to the core or to a portion of the curable compound other than the core; provided that no substituents of formula (1) are in an ortho position to each other on the same aromatic ring of the core;
a polymer chosen from: acrylates, vinyl aromatic polymers, novolacs, polyphenylenes, polybenzoxazoles, polybenzimidazoles, polyetheresulfones, and combinations thereof, or a B-staged reaction product of a second curable compound comprising a core chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and two or more substituents of formula (B-1) attached to the core, wherein the core is optionally further substituted:

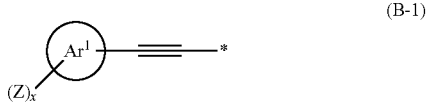

(B-1)

wherein in formula (B-1): $Ar^1$ is chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Z is a substituent independently chosen from $OR^1$, protected hydroxyl, carboxyl, protected carboxyl, $SR^1$, protected thiol, —O—C(=O)—$C_{1-6}$ alkyl, halogen, and $NHR^2$; wherein each $R^1$ is independently chosen from H, $C_{1-10}$ alkyl, $C_{2-10}$ unsaturated hydrocarbyl, and $C_{5-30}$ aryl; each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$-$R^1$; x is an integer from 1 to the total number of available aromatic ring atoms in $Ar^1$; and * denotes the point of attachment to the core or to a portion of the curable compound other than the core; provided that no substituents of formula (B-1) are in an ortho position to each other on the same aromatic ring of the core; and one or more solvents, wherein the total solvent content is from 50 to 99 wt % based on the coating composition.

2. The coating composition of claim 1, wherein the polymer is chosen from acrylates, vinyl aromatic polymers, novolacs, polyphenylenes, and combinations thereof.

3. The coating composition of claim 1, wherein each Z of formula (1) is independently chosen from $OR^1$, protected hydroxyl, carboxyl, protected carboxyl, SH, —O—C(=O)—$C_{1-6}$ alkyl, and $NHR^2$.

4. The coating composition of claim 3, wherein each Z of formula (1) is hydroxyl.

5. The coating composition of any of claim 1, wherein the core of the first curable compound is chosen from pyridine, benzene, naphthalene, quinoline, isoquinoline, anthracene, phenanthrene, pyrene, coronene, triphenylene, chrysene, phenalene, benz [a] anthracene, dibenz[a,h]anthracene, and benzo [a] pyrene.

6. The coating composition of claim 1, wherein each $Ar^1$ of formula (1) is independently chosen from pyridine, benzene, naphthalene, quinoline, isoquinoline, anthracene, phenanthrene, pyrene, coronene, triphenylene, chrysene, phenalene, benz [a] anthracene, dibenz[a,h]anthracene, and benzo [a] pyrene.

7. The coating composition of claim 1, further comprising a curing agent, a surface leveling agent, or a flow additive.

8. The coating composition of claim 1, further comprising a crosslinker that is different from the first curable compound and the polymer.

9. A coated substrate, comprising:
an electronic device substrate; and
a layer formed from a coating composition of claim 1 on a surface of the electronic device substrate.

10. A method of forming an electronic device, comprising:
(a) providing an electronic device substrate;
(b) coating a layer of a coating composition of claim 1 on a surface of the electronic device substrate; and
(c) curing the layer of the curable compound to form a cured layer.

11. The method of claim 10, wherein the cured layer is a photoresist underlayer, the method further comprising:
(d) forming a photoresist layer over the underlayer;
(e) patternwise exposing the photoresist layer to activating radiation;
(f) developing the exposed photoresist layer to form a pattern in the photoresist layer; and
(g) transferring the pattern to the underlayer.

12. The method of claim 11, further comprising coating one or more of a silicon-containing layer, an organic antireflective coating layer, or a combination thereof over the underlayer before step (d).

13. The method of claim 12, further comprising transferring the pattern to the one or more of the silicon-containing layer, the organic antireflective coating layer, or the combination thereof after step (f) and before step (g).

14. The method of claim 11, further comprising:
(h) transferring the pattern to a layer of the electronic device substrate below the patterned underlayer; and
(i) removing the patterned underlayer.

15. The method of claim 10, wherein the polymer is chosen from acrylates, vinyl aromatic polymers, novolacs, polyphenylenes, and combinations thereof.

16. The method of claim 10, wherein the polymer is a B-staged reaction product of a second curable compound comprising a core chosen from a $C_6$ carbocyclic aromatic ring, a $C_{2-5}$ heterocyclic aromatic ring, a $C_{9-30}$ fused carbocyclic aromatic ring system, a $C_{4-30}$ fused heterocyclic aromatic ring system, $C_{1-20}$ aliphatic, and $C_{3-20}$ cycloaliphatic, and two or more substituents of formula (B-1) attached to the core:

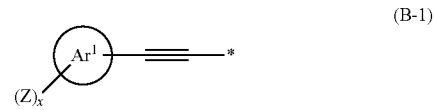

(B-1)

wherein in formula (B-1): $Ar^1$ is chosen from a $C_6$ carbocyclic aromatic ring, a $C_{2-5}$ heterocyclic aromatic ring, a $C_{9-30}$ fused carbocyclic aromatic ring system, and a $C_{4-30}$ fused heteroocyclic aromatic ring system; Z is a substituent independently chosen from $OR^1$, protected hydroxyl, carboxyl, protected carboxyl, $SR^1$, protected thiol, —O—C(=O)—$C_{1-6}$ alkyl, halogen, and $NHR^2$;

wherein each $R^1$ is independently chosen from H, $C_{1-10}$ alkyl, $C_{2-10}$ unsaturated hydrocarbyl, and $C_{5-30}$ aryl; each $R^2$ is independently chosen from H, $C_{1-10}$ alkyl, $C_{2-10}$ unsaturated hydrocarbyl, $C_{5-30}$ aryl, C(=O)—$R^1$, and S(=O)$_2$-$R^1$; x is an integer from 1 to the total number of available aromatic ring atoms in $Ar^1$; and * denotes the point of attachment to the core or to a portion of the curable compound other than the core; provided that no substituents of formula (B-1) are in an ortho position to each other on the same aromatic ring of the core.

17. The method of claim 10, wherein each Z of formula (1) is independently chosen from $OR^1$, protected hydroxyl, carboxyl, protected carboxyl, SH, —O—C(=O)—$C_{1-6}$ alkyl, and $NHR^2$.

18. The method of claim 17, wherein each Z of formula (1) is hydroxyl.

* * * * *